(12) United States Patent
Weng et al.

(10) Patent No.: US 7,187,067 B2
(45) Date of Patent: Mar. 6, 2007

(54) SENSOR CHIP PACKAGING STRUCTURE

(75) Inventors: Gwo-Liang Weng, Kao-Hsiung (TW);
Yung-Li Lu, Kao-Hsiung Hsien (TW);
Ying-Tsai Yeh, Kao-Hsiung Hsien (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 0 days.

(21) Appl. No.: 11/163,869

(22) Filed: Nov. 2, 2005

(65) Prior Publication Data
US 2006/0091515 A1    May 4, 2006

(30) Foreign Application Priority Data
Nov. 3, 2004    (TW)    ................ 93133481 A

(51) Int. Cl.
*H01L 23/02*    (2006.01)
(52) U.S. Cl. ...................... 257/680; 257/254
(58) Field of Classification Search ........ 257/222–254, 257/415, 424, 444, 678–680, 99–100, 255–257; 438/116
See application file for complete search history.

(56) References Cited

U.S. PATENT DOCUMENTS

| | | |
|---|---|---|
| 6,401,545 B1 | 6/2002 | Monk et al. |
| 6,987,312 B2 * | 1/2006 | Theuss ....................... 257/680 |
| 2002/0163601 A1 * | 11/2002 | Min et al. ..................... 349/33 |
| 2005/0259853 A1 * | 11/2005 | Miyai et al. ................ 382/124 |
| 2005/0263836 A1 * | 12/2005 | Okada et al. ............... 257/415 |

* cited by examiner

*Primary Examiner*—Nathan W. Ha
(74) *Attorney, Agent, or Firm*—Winston Hsu

(57) ABSTRACT

A sensor chip for defining an exposed molding region is disclosed. The sensor chip includes a semiconductor chip and a metal dam bar protruding from the active surface of the semiconductor chip. The active surface of the semiconductor chip includes a sensing region and at least one bonding pad is disposed on the active surface. The metal dam bar separates the sensing region and the bonding pad to prevent contamination of the sensing region by the mold flash. Preferably, a step is formed on the periphery of the active surface of the semiconductor chip, such that the semiconductor chip includes a T-shaped profile. Additionally, the metal dam bar is extended to the step to form an enclosed ring thereby effectively defining an exposed molding region that contains the sensing region.

15 Claims, 9 Drawing Sheets

SENSOR CHIP PACKAGING STRUCTURE

BACKGROUND OF THE INVENTION

1. Field of the Invention

The invention relates to a sensor chip, and more particularly, to a pressure sensor chip for fingerprint recognition.

2. Description of the Prior Art

In recent history, the technology of fabricating sensor chips has developed and expanded to incorporate the recognition and sensing capabilities of a sensor chip into a semiconductor chip to achieve minimal size. The sensor chips, depending on various designs and requirements, can be fingerprint sensors or image sensor chips. The conventional method of fabricating sensor chips involves forming a sensing region on the active surface of the semiconductor chip, in which the sensing region should be covered during the packaging process. After the packaging process is completed, the sensor chip can be accessorized to portable electronic devices, including: mobile phones, notebook computers, and PDA's. The sensor chip is commonly utilized in said portable electronic devices for facilitating user fingerprint recognition and capturing images.

Please refer to FIG. 1 and FIG. 2. FIG. 1 is a diagram showing the active surface of a sensor chip 100 according to the prior art. FIG. 2 is a diagram showing a cross-section of the sensor chip 100. As shown in FIG. 1, the sensor chip 100 is fabricated from a semiconductor chip 110, in which the semiconductor chip 110 includes an active surface 111 and a corresponding back surface 112, as shown in FIG. 2. The active surface 111 includes a sensing region 113, a plurality of sensing devices (not shown), and a plurality of bonding pads 120 disposed on the active surface 111, in which the sensing region 113 should not be covered by a molding compound 230 during the packaging process. During the packaging process, the back surface 112 of the sensor chip 100 is first attached to a chip carrier 210 and a plurality of bonding wires 220 are utilized to electrically connect the bonding pads 120 to the chip carrier 210. Next, a molding compound 230 is formed to seal the bonding wires 220 and part of the active surface 111 containing the bonding pads 120 while exposing the sensing region 113, in which the molding compound 230 can be formed via dispensing or molding processes. However, an overly low speed of the dispensing process will result in an uneven shape of the molding compound thereby resulting in the ability to control the area of the active surface to be uncontrollable. Similarly, when the molding process is performed, the mold flash will contaminate the sensing region 113 and influence the function of the sensor chip. Furthermore, when the sensor chip 100 is applied to fingerprint recognition, the active surface 111 must be touched frequently by fingers and this further increases a peeling phenomenon to occur at the edge of the passivation layer 130 on the active surface 111.

SUMMARY OF THE INVENTION

It is therefore an objective of the present invention to provide a sensor chip for defining an exposed molding region on an active surface, in which the sensor chip includes a semiconductor chip and a metal dam bar protruding from the active surface of the semiconductor chip. Preferably, the active surface of the semiconductor chip includes a sensing region and at least a bonding pad. By utilizing the metal dam bar to separate the sensing region and the bonding pads, the present invention is able to effective prevent contamination of the sensing region by the mold flash.

It is another aspect of the present invention to provide a sensor chip for defining an exposed molding region on an active surface, in which the periphery of the active surface of the semiconductor chip includes a step for forming a T-shaped profile. Additionally, the metal dam bar is extended to the step to form a closed ring and define a molding region.

It is another aspect of the present invention to provide a sensor chip for defining an exposed molding region on an active surface, in which the step includes a region not covered by the metal dam bar, such that the region can be encapsulated by a molding compound during the packaging process and facilitate the positioning of the sensor chip on the chip carrier.

It is another aspect of the present invention to provide a sensor chip for defining an exposed molding region on an active surface, in which the metal dam bar is composed of gold. Preferably, the metal dam bar is electrically couple to the grounding pad of the sensor chip to reduce electrostatic discharge.

It is another aspect of the present invention to provide a sensor chip for defining an exposed molding region on an active surface, in which the height of the protrusion of the metal dam bar from the active surface is between 15 to 25 μm. By having the metal dam bar higher than the bonding pads of the semiconductor chip, the present invention is able to increase the efficiency of blocking the mold flash overflow.

It is another aspect of the present invention to provide a method for fabricating a sensor chip, the method includes the following steps: providing a semiconductor chip having an active surface and a corresponding back surface, in which the active surface further includes a sensing region and the semiconductor chip comprises at least a bonding pad disposed on the active surface; and forming a metal dam bar on the semiconductor chip, in which the metal dam bar is protruding from the active surface and separating the sensing region and the bonding pad. Preferably, when the semiconductor chip is in a wafer state, the wafer further includes a plurality of dies and a plurality of scribe lines for forming a plurality of sensor chips. Additionally, a pre-cutting process is performed before the formation of the metal dam bar to form a plurality of scribing grooves corresponding to the scribe lines for forming a step for each die on the periphery of the active surface.

It is another aspect of the present invention to provide a sensor chip packaging structure, in which the sensor chip packaging structure includes a sensor chip, a chip carrier, at least a connective device, and a molding compound. Preferably, the chip carrier is attached to the back surface of the semiconductor chip, and the molding compound is disposed on the chip carrier and surrounding the semiconductor chip. Additionally, the active surface of the semiconductor chip is partially enclosed by the molding compound along the metal dam bar to expose the sensing region, such that the metal dam bar is able to prevent contamination of the sensing region by the molding compound during the molding process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
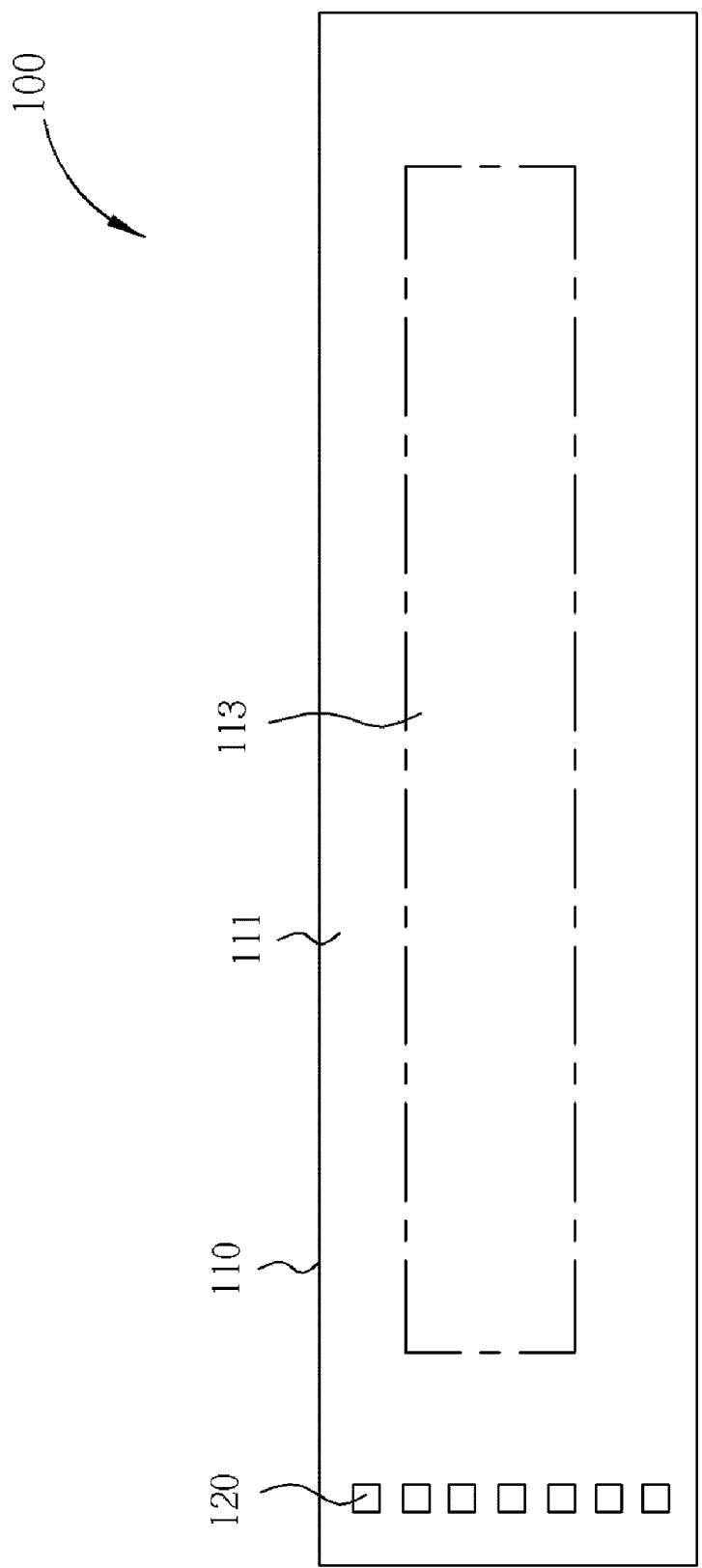
FIG. 1 is a diagram showing the active surface of a sensor chip according to the prior art.
Figure 2:
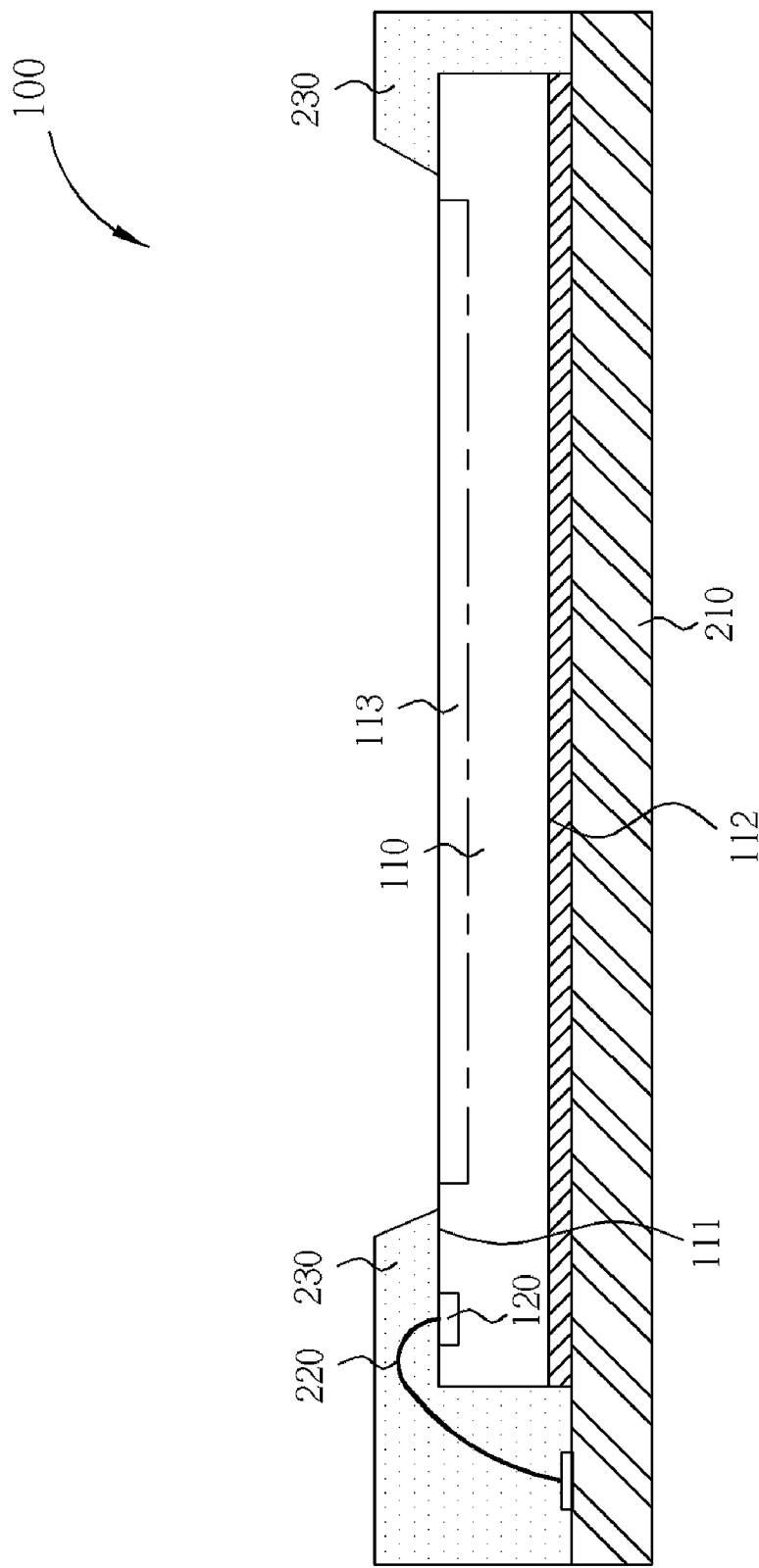
FIG. 2 is a diagram showing a cross-section of the sensor chip according to the prior art.
Figure 3:
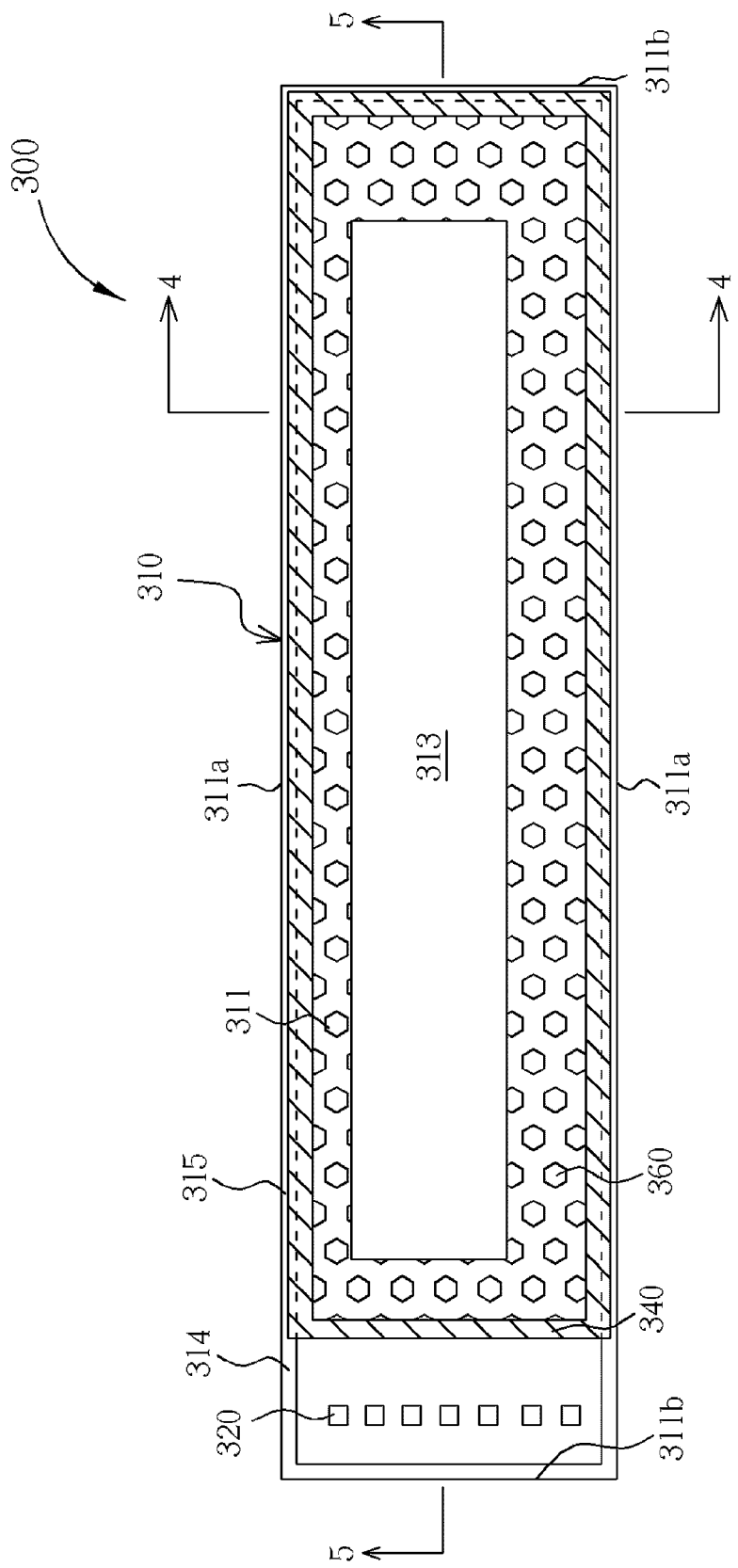
FIG. 3 is a diagram showing the active surface of a sensor chip according to the present invention.
Figure 4:
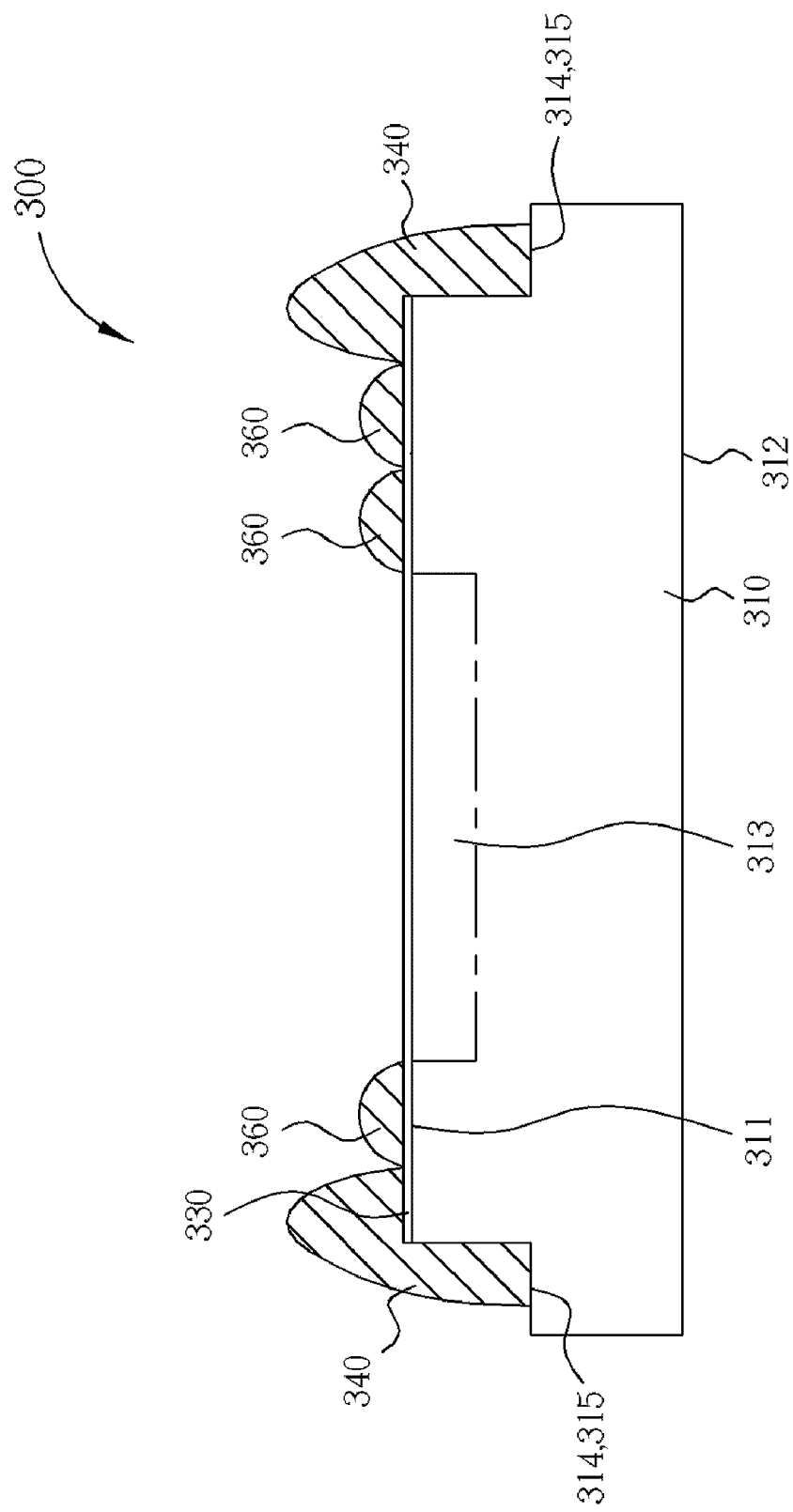
FIG. 4 is a diagram showing the cross-section of the sensor chip as shown in FIG. 3 along line 4—4.
Figure 5:
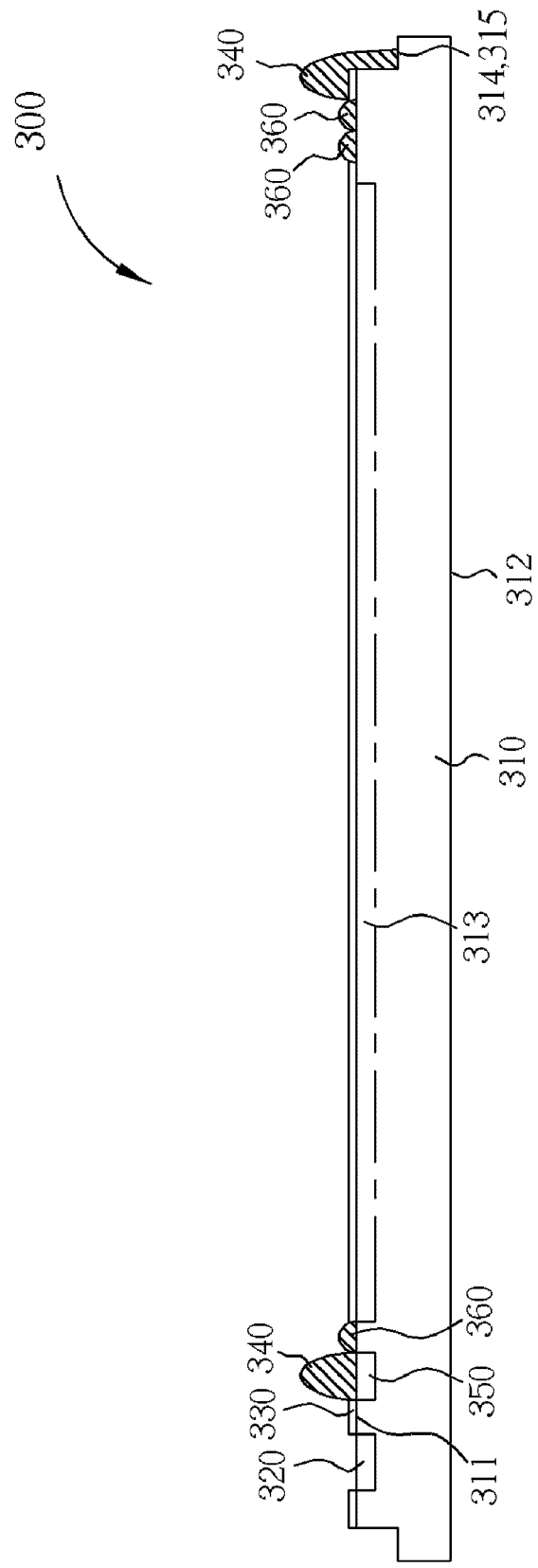
FIG. 5 is a diagram showing the cross-section of the sensor chip as shown in FIG. 3 along line 5—5.

Please refer to FIG. 3 through FIG. 5. FIG. 3 is a diagram showing the active surface of a sensor chip 300 according to the present invention. FIG. 4 is a diagram showing the cross-section of the sensor chip 300 as shown in FIG. 3 along line 4—4, and FIG. 5 is a diagram showing the cross-section of the sensor chip 300 as shown in FIG. 3 along line 5—5.

As shown in FIG. 3 through FIG. 5, the sensor chip 300 is a fingerprint sensor, in which the sensor chip 300 includes a semiconductor chip 310, a plurality of bonding pads 320, and a dam bar 340. Preferably, the semiconductor chip 310 includes an active surface and a corresponding back surface 312, in which the active surface 311 includes a sensing region 313 for recognizing fingerprints or sensing other objects. According to the preferred embodiment of the present invention, the active surface 311 is rectangular and includes two corresponding longer sides 311a and two corresponding shorter sides 311b. As shown in FIG. 3, the bonding pads 320 are located adjacent to one of the shorter sides 311b, in which the bonding pads 320 can be arranged in single rows or multiple rows. The sensing region 313 is located vertically between the two longer sides 311a to facilitate finger contacts and thereby conduct fingerprint recognition functions. As shown in FIG. 4 and FIG. 5, the sensor chip 300 also includes a passivation layer 330 on the active surface 311. Additionally, the semiconductor chip 310 includes a step 314 formed on the periphery of the active surface 311, in which the step 314 creates a T-shaped profile for facilitating the adhesion of the dam bar 340.

Preferably, the dam bar 340 is protruding from the active surface 311 of the semiconductor chip 310 and separating the sensing region 313 and the bonding pads 320, in which the height of the protrusion of the dam bar 340 from the active surface 311 is between 15 to 25 μm for preventing contamination of the sensing region 313 by the mold flash. In order to connect the dam bar 340, a bar pad 350 can be disposed on the active surface 311 and between the sensing region 313 and the bonding pads 320 for connecting the dam bar 340. Preferably, the dam bar 340 is composed of gold for removing electrostatic discharges.

As shown in FIG. 3 and FIG. 4, the dam bar 340 can be extended to the step 314 and form a closed ring, thereby defining an exposed molding region containing the sensing region 313. According to the preferred embodiment of the present invention, the dam bar 340 is extended to the two longer sides of the active surface 311 and the step 314 of one of the shorter sides. Additionally, the dam bar 340 encloses the edge of the passivation layer 330 to prevent the passivation layer 330 from peeling off as a result of excessive sensing being performed.

The step 314 includes a region not covered by the dam bar 340, such that the region can be enclosed by the molding compound thereby increasing the integration and unification of the sensor chip 300. A plurality of metal bumps 360 is often disposed on the active surface 311 of the semiconductor chip 310, in which the metal bumps 360 are located in the exposed molding region and between the dam bar 340 and the sensing region 313 to prevent electrostatic discharge (ESD) from damaging the sensor chip 300. Preferably, at least one of the metal bumps 360 is electrically connected to the dam bar 340, the bonding pads 320 include at least a grounding pad, and the dam bar 340 is electrically coupled to the grounding pad for decreasing the probability of electrostatic discharge.

Figure 6:
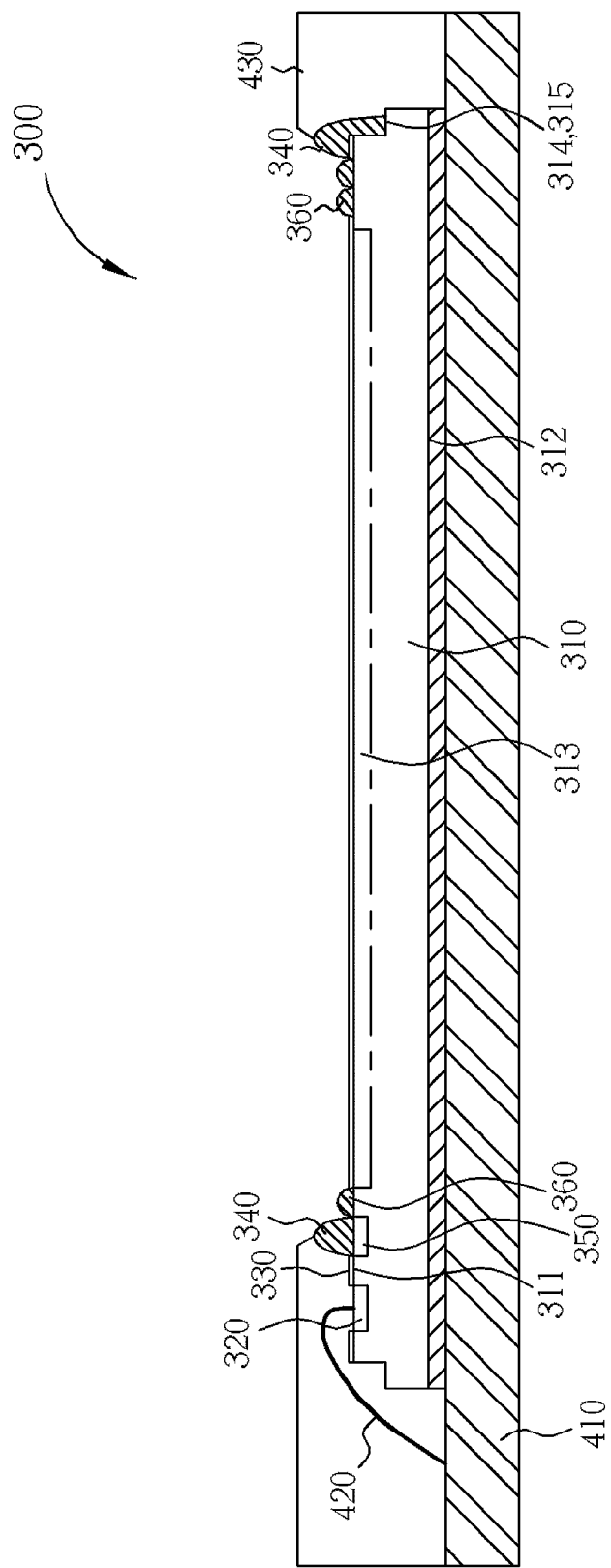
FIG. 6 is a diagram showing a package structure containing the sensor chip according to the present invention.

Please refer to FIG. 6. FIG. 6 is a diagram showing a package structure containing the sensor chip according to the present invention. As shown in FIG. 6, the package structure includes the sensor chip 300, a chip carrier 410, at least a connective device 420, and a molding compound 430. Preferably, the sensor chip 300 is attached to the chip carrier 410, such as a BT or FR-4 circuit board by utilizing the back surface 312 of the semiconductor chip 310, and the connective device 420, such as bonding wires, is utilized to connect the bonding pads 320 to the chip carrier 410. The molding compound 430 is disposed on the chip carrier 410 and surrounding the semiconductor chip 310, in which the molding compound 430 is formed by a molding process and joins the chip carrier 410 and the sensor chip 300 with a mold. Preferably, the molding compound 430 includes an inclined surface connected to the dam bar 340, in which the molding compound 430 will partially cover the active surface 311 of the semiconductor chip 310 along the dam bar 340 and the region of the step 314 not having the dam bar 340 during the molding process. Consequently, the sensing region 313 will be exposed and the dam bar 340 will effectively prevent contamination of the sensing region 313 by the mold flash.

Figure 7:
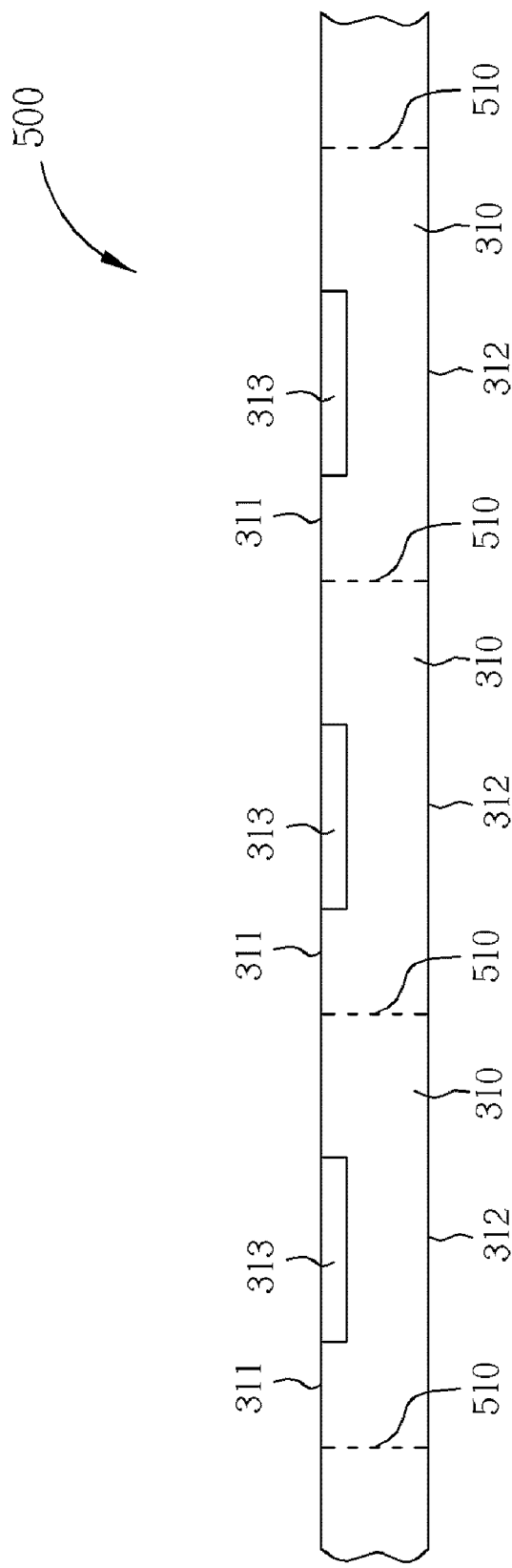
FIG. 7 through FIG. 9 are diagrams showing the method of fabricating sensor chips according to the present invention.
Figure 8:
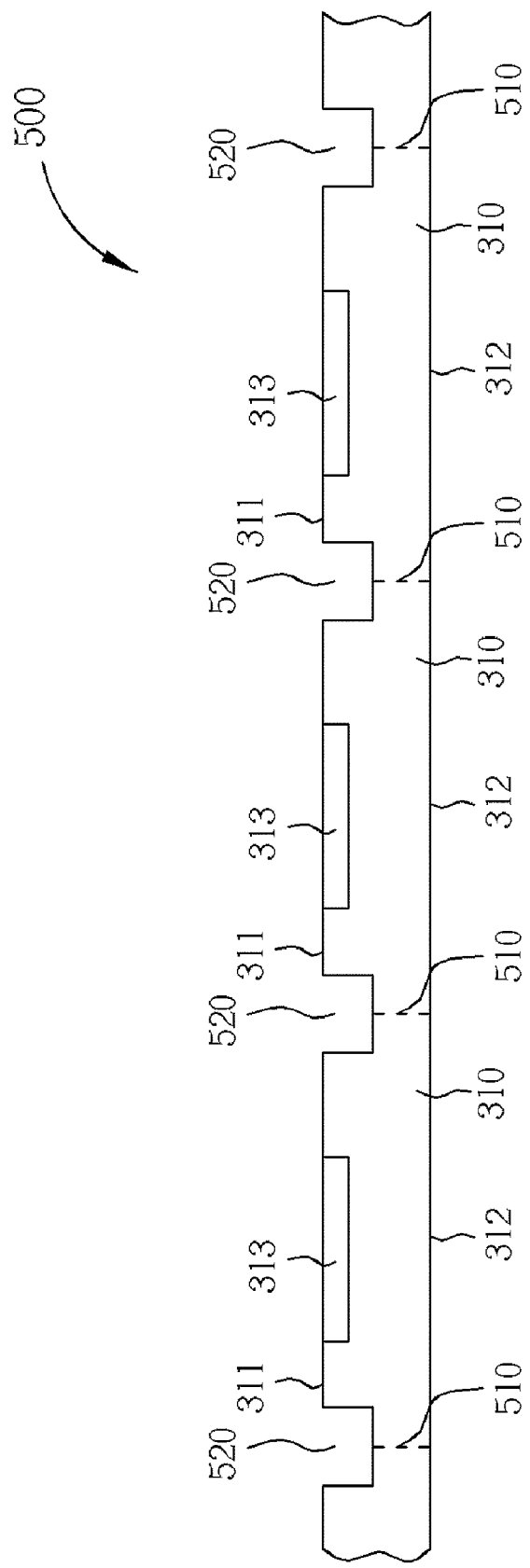
Figure 9:
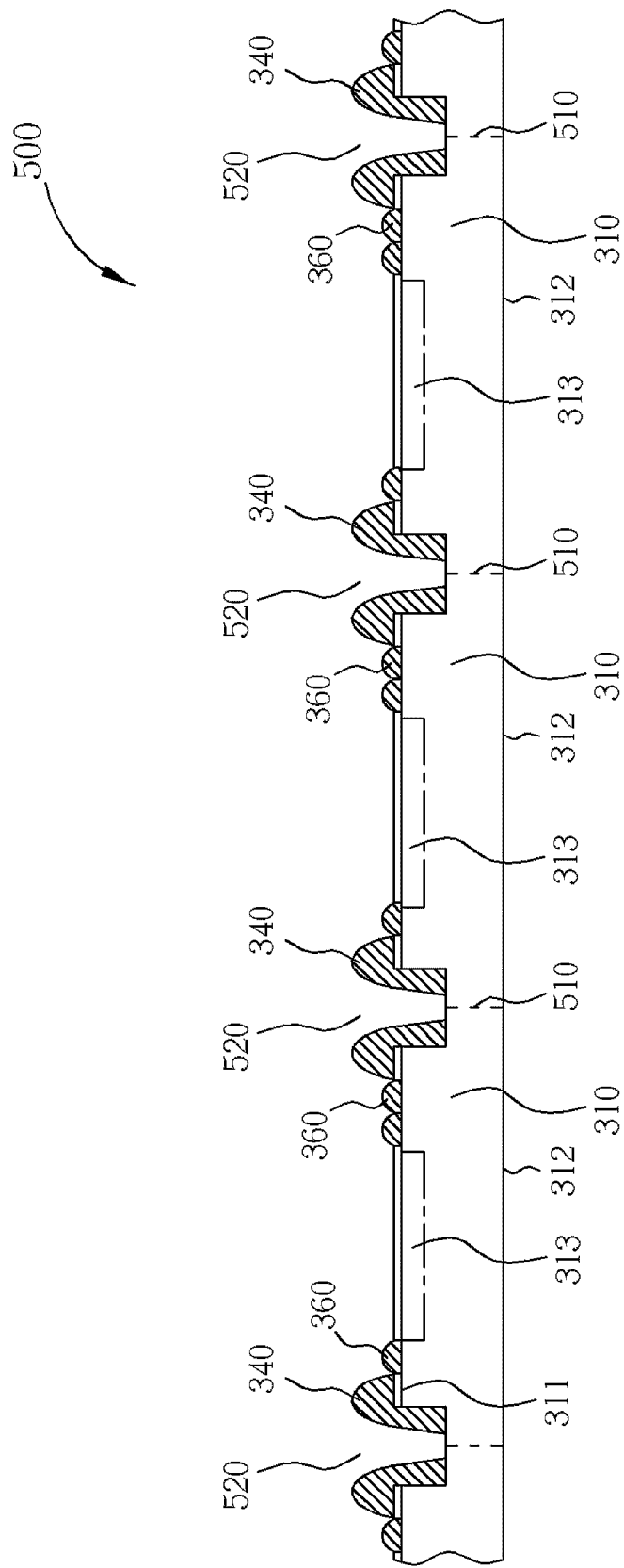

Please refer to FIG. 7 through FIG. 9. FIG. 7 through FIG. 9 are diagrams showing the method of fabricating sensor chips according to the present invention. As shown in FIG. 7, a plurality of semiconductor chips 310 is provided, in which the semiconductor chips 310 are monolithically formed in a wafer 500. Preferably, a scribe line 510 is formed between the semiconductor chips 310 to facilitate the dicing process performed thereafter for producing a plurality of sensor chips 300. Each semiconductor chip 310 includes an active surface 311 and a corresponding back surface 312, in which each active surface 311 includes a sensing region 313 and at least one bonding pad 320 disposed on the active surface 311. As shown in FIG. 8, a pre-cutting process is performed to form a plurality of scribing grooves 520 corresponding to the scribe lines 510 and ultimately form the step 314 of the sensor chips 300. As shown in FIG. 9, an electroplating process can be performed to form a dam bar 340 on each of the semiconductor chips 310, in which the dam bars 340 are protruding from the active surface 311 and separate the sensing region 313 from the bonding pads 320. Additionally, portions of the dam bars 340 are partially extended through the scribing grooves and enclose the passivation layer 330 and the periphery of the active surface 311. In order to reduce cost, the metal bumps 360 described above can be fabricated in the same electroplating process along with the dam bars 340. Subsequently, a dicing process is performed to dice the wafer 500 along the scribe lines 510 to form a plurality of sensor chips 300. After individual sensor chips 300 are formed, the scribing groove 520 will become the step 314 described previously and the semiconductor chip 310 will have a T-shaped profile, thereby facilitating the enclosure of the molding compound and increasing the integration of the sensor chip 300.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensor chip packaging structure comprising:
   a chip carrier having a front surface and a corresponding back surface, wherein the chip carrier has at least a contact pad on the front surface;
   a semiconductor chip having an active surface and a corresponding back surface, wherein the active surface comprises a sensing region, and the semiconductor chip is attached to the front surface of the chip carrier;
   at least a bonding pad and at least a grounding pad disposed on the active surface;
   a metal dam bar electrically coupled to the grounding pad, protruding from the active surface and separating the sensing region and the bonding pad for removing electrostatic discharges;
   at least a connective device electrically connecting the bonding pad to the contact pad of the chip carrier; and
   a molding compound disposed on the chip carrier and surrounding the semiconductor chip, wherein the molding compound partially encloses the active surface of the semiconductor chip along the metal dam bar for exposing the sensing region.

2. The sensor chip packaging structure of claim 1, wherein the semiconductor chip is a fingerprint sensor.

3. The sensor chip packaging structure of claim 1, wherein the height of the protrusion of the metal dam bar from the active surface is between 15 to 25 μm.

4. The sensor chip packaging structure of claim 1, wherein the periphery of the active surface of the semiconductor chip comprises a step.

5. The sensor chip packaging structure of claim 4, wherein the semiconductor chip comprises a T-shaped profile.

6. The sensor chip packaging structure of claim 4, wherein the metal dam bar is extended to the step for forming a closed ring.

7. The sensor chip packaging structure of claim 6, wherein the step comprises a region enclosed by the molding compound but not covered by the metal dam bar.

8. The sensor chip packaging structure of claim 1 further comprising a bar pad disposed on the active surface and between the sensing region and the bonding pad for connecting the metal dam bar.

9. The sensor chip packaging structure of claim 1 further comprising a passivation layer formed on the active surface.

10. The sensor chip packaging structure of claim 9, wherein the metal dam bar encloses an edge of the passivation layer.

11. The sensor chip packaging structure of claim 1, wherein the bonding pad is situated adjacent to a shorter side of the active surface.

12. The sensor chip packaging structure of claim 1 further comprising a plurality of metal bumps disposed on the active surface and between the metal dam bar and the sensing region.

13. The sensor chip packaging structure of claim 12, wherein at least one of the metal bumps is electrically connected to the metal dam bar.

14. The sensor chip packaging structure of claim 1, wherein the molding compound comprises an inclined surface connecting to the metal dam bar.

15. The sensor chip packaging structure of claim 1, wherein the connective device comprises a bonding wire.

* * * * *